(12) United States Patent
Monroe

(10) Patent No.: US 8,624,129 B2
(45) Date of Patent: Jan. 7, 2014

(54) METHOD OF ATTACHING A HIGH POWER SURFACE MOUNT TRANSISTOR TO A PRINTED CIRCUIT BOARD

(75) Inventor: Robert W. Monroe, Melissa, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1250 days.

(21) Appl. No.: 11/330,774

(22) Filed: Jan. 12, 2006

(65) Prior Publication Data

US 2007/0158102 A1 Jul. 12, 2007

(51) Int. Cl.
*H05K 1/16* (2006.01)

(52) U.S. Cl.
USPC .............. 174/260; 174/252; 174/262

(58) Field of Classification Search
USPC ......................... 174/252, 260, 262
See application file for complete search history.

(56) References Cited

U.S. PATENT DOCUMENTS

| | | | |
|---|---|---|---|
| 4,729,061 A * | 3/1988 | Brown | 361/719 |
| 4,993,148 A * | 2/1991 | Adachi et al. | 29/832 |
| 5,291,063 A * | 3/1994 | Adishian | 257/712 |
| 5,616,888 A * | 4/1997 | McLaughlin et al. | 174/260 |
| 5,923,084 A * | 7/1999 | Inoue et al. | 257/712 |
| 6,060,778 A * | 5/2000 | Jeong et al. | 257/710 |
| 6,172,419 B1 * | 1/2001 | Kinsman | 257/737 |
| 6,365,963 B1 * | 4/2002 | Shimada | 257/686 |
| 6,879,488 B2 * | 4/2005 | Takeda et al. | 361/704 |
| 2002/0189853 A1 * | 12/2002 | Hsu | 174/252 |
| 2005/0167789 A1 * | 8/2005 | Zhuang | 257/659 |

\* cited by examiner

*Primary Examiner* — Ishwarbhai Patel

(57) ABSTRACT

A power device that includes a printed circuit board having one or more dielectric and copper layers between a top and a bottom metal layer. The power device includes an area extending through all metal and dielectric layers of the printed circuit board except the bottom metal layer. A semiconductor device is positioned within the area and mounted to the bottom metal layer of the printed circuit board.

14 Claims, 5 Drawing Sheets

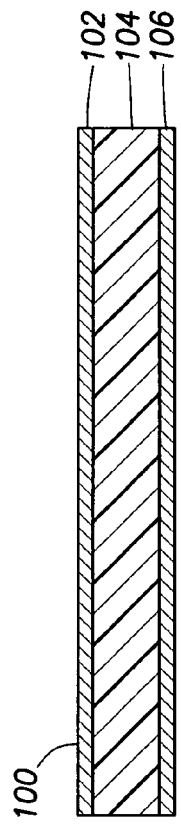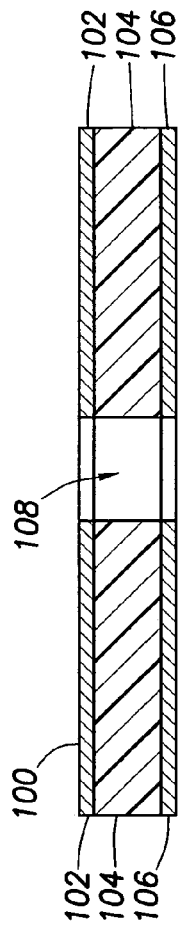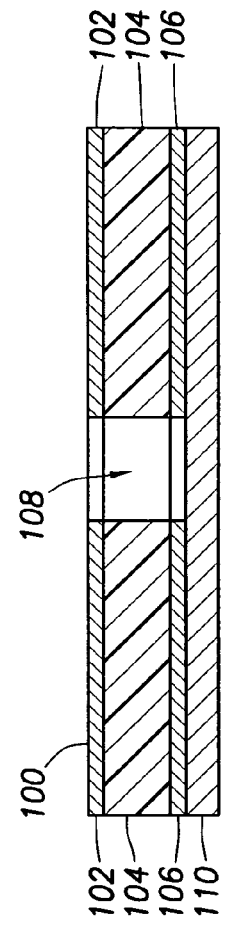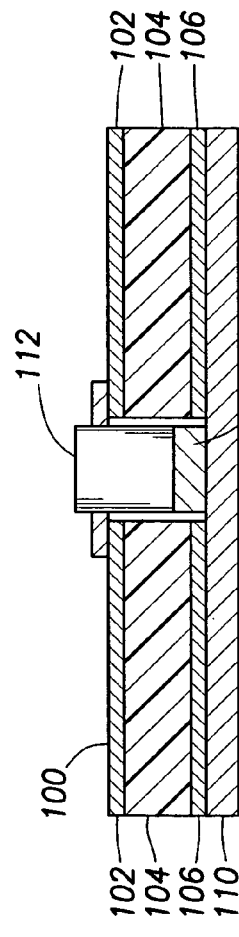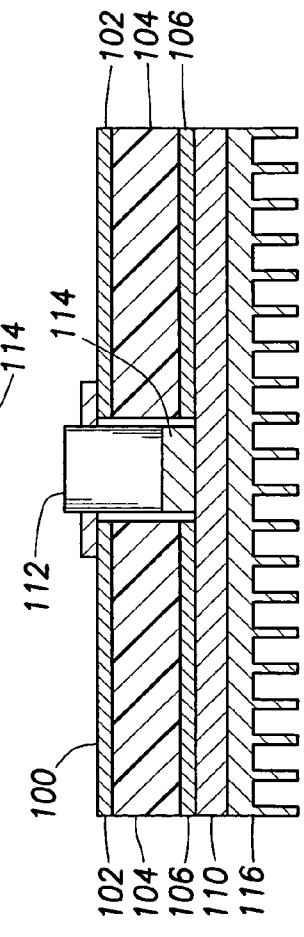
FIG. 1a (PRIOR ART)
FIG. 1b (PRIOR ART)
FIG. 1c (PRIOR ART)
FIG. 1d (PRIOR ART)
FIG. 1e (PRIOR ART)

METHOD OF ATTACHING A HIGH POWER SURFACE MOUNT TRANSISTOR TO A PRINTED CIRCUIT BOARD

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present disclosure relates to the mounting of transistors onto printed circuit boards and more specifically, but not by way of limitation, to methods and systems for using the bottom copper layer of a printed circuit board to mount a high power transistor flange, or as a backstop to prevent solder from leaking out of "filled" or "thermal" vias during the mounting of a surface mount transistor.

BACKGROUND OF THE INVENTION

A printed circuit board (or PCB) interconnects electronic components using flat conductive traces laminated onto a non-conductive substrate (dielectric) and using drilled, plated-through holes (vias) to connect one or more metal layers together. The vast majority of PCBs are made by taking copper laminated dielectrics and removing unwanted copper by chemically etching or mechanically milling away the copper, leaving only the desired copper traces. Electrical interconnections between the different metal layers are made by the plated-through hole vias. Accordingly, vias not only provide an electrical path through the dielectric layers, but also an enhanced thermal path for heat flow.

SUMMARY OF THE INVENTION

In one embodiment, a PCB is provided that includes a printed circuit board having one or more dielectric and copper layers between a top and a bottom metal layer. The power device includes an area that extends through the metal and dielectric layers of the printed circuit board. The area extends through the top but not through the bottom metal layer. A semiconductor device is positioned within the area and mounted to the bottom metal layer of the printed circuit board.

In another embodiment, a method of attaching a semiconductor device to a printed circuit board is provided. The method includes a printed circuit board having one or more dielectric and copper layers between a top and a bottom copper layer. An area is formed by etching and milling through all copper and dielectric layers within the area except for the bottom copper layer. A semiconductor device is positioned within the area and mounted to the bottom copper layer of the printed circuit board.

In yet another embodiment, a power device is provided that includes a printed circuit board having one or more dielectric and copper layers between a top and a bottom copper layer. The device includes one or more vias extending through at least one or more of the dielectric and copper layers of the printed circuit board. The one or more vias not extending through the bottom copper layer. A surface mount device is mounted to the top copper layer above the vias using a conductive paste (e.g. solder) such that the bottom copper layer of the printed circuit board prevents the conductive paste from leaking out of the vias during infrared reflow.

These and other features and advantages will be more clearly understood from the following detailed description taken in conjunction with the accompanying drawings and claims.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIGS. 1a-1e illustrate a prior art method of mounting a high power transistor, such as those used in the power amplifiers of wireless base stations, onto a printed circuit board and heat sink.

DETAILED DESCRIPTION OF THE PREFERRED EMBODIMENTS

Figure 2A:
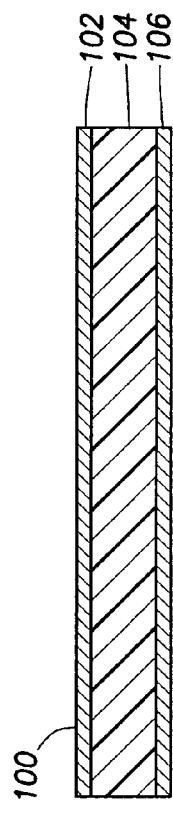
FIGS. 2a-2d illustrate an innovative system and method according to one embodiment of the present disclosure of mounting a high power transistor onto a printed circuit board using the bottom copper layer of the printed circuit board to solder mount the transistor flange.

It should be understood at the outset that although an exemplary implementation of one embodiment of the present disclosure is illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents.

The present disclosure relates to a power device that includes a printed circuit board having one or more dielectric and copper layers between a top and bottom copper layer. The printed circuit board includes a transistor area extending through all metal and dielectric layers of the printed circuit board except that the transistor area does not extend through the bottom metal layer. Accordingly, a transistor can be positioned within the transistor area and mounted directly to the bottom metal layer of the printed circuit board without the need for a carrier plate to support the transistor.

In another embodiment, the present disclosure also relates to a power device that includes a transistor area with one or more vias extending through all copper and dielectric layers of the printed circuit board except that the vias in the transistor area do not extend through the bottom copper layer. A surface mount transistor can be mounted above the vias using a conductive paste (e.g. solder) such that the bottom copper layer of the printed circuit board acts as a backstop to prevent the conductive paste from leaking out of the vias during infrared reflow. Accordingly, the formation of bulges on the bottom side of the printed circuit board resulting from the leakage of conductive paste is eliminated, and a flat surface is left for mounting a heatsink.

FIGS. 1a-1e illustrate a prior art method of mounting a high power transistor, such as those used in the power amplifiers of wireless base stations, onto a printed circuit board and heat sink. A high power transistor is generally understood to have a power dissipation greater than 1 watt. FIG. 1a illustrates a PCB 100, which is a bare, i.e. no components, printed circuit board having a dielectric layer 104 between a top copper layer 102 and a bottom copper layer 106. In FIG. 1b, a transistor area 108 is formed by milling and etching an area out of PCB 100 that extends through top copper layer 102, dielectric layer 104, and bottom copper layer 106. Because transistor area 108 extends completely through PCB 100, there is no longer a surface on which to mount the flange of a transistor once it is placed into transistor area 100. Therefore, the attachment of a carrier plate to the bottom side of PCB 100 is necessary if a transistor is to be mounted within transistor area 108. FIG. 1c illustrates a copper carrier plate 110 attached directly to the bottom side of PCB 100. In FIG. 1d, the top side of copper carrier plate 110 is used to solder mount a high power transistor 112 having a flange 114. After infrared reflow, FIG. 1e illustrates a heatsink 116 attached directly to the bottom side of copper carrier plate 110.

Generally, infrared (IR) reflow soldering, as is well known to those skilled in the art, is a common means to attach a surface mounted component to a circuit board, and typically consists of applying solder paste, positioning the devices, and reflowing the solder in a conveyorized oven. The goal of the reflow process is to melt the powder particles in the solder paste, wet the surfaces being joined together, and solidify the solder to create a strong metallurgical bond.

With the prior art method of forming transistor areas, the use of carrier plates is also essential because semiconductor devices in general are prone to damage from overheating, so providing a path for heat transfer from the device to the ambient air is very important, especially when the circuit in question may handle large amounts of power. This heat-dissipating path is typically formed by attaching a heatsink to the carrier plate on which the semiconductor device is mounted.

The use of carrier plates add additional material costs, as well as additional supply management costs due to the extra step required to coat the carrier plate to prevent oxidation and improve solderability. However, they are necessary because the prior art forms transistor areas by drilling through the entire printed circuit board leaving no surface on which a transistor could be mounted within the transistor area. Therefore, carrier plates are attached to the bottom of printed circuit boards to provide a mounting surface for the transistor, as well as the heat dissipating device.

Aluminum carrier plates may also be used but are not solderable. Therefore, aluminum carrier plates require the additional steps of zincating prior to plating electroless nickel, which can then be followed by electroplated copper, tin/lead, or gold to provide solderability.

Figure 2B:
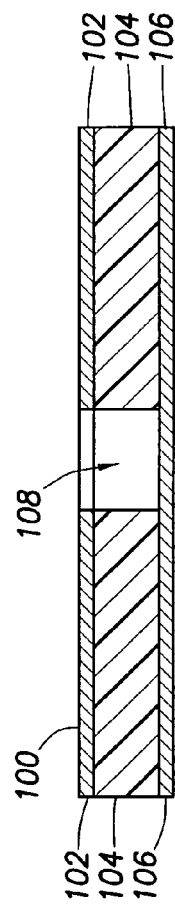
Figure 2C:
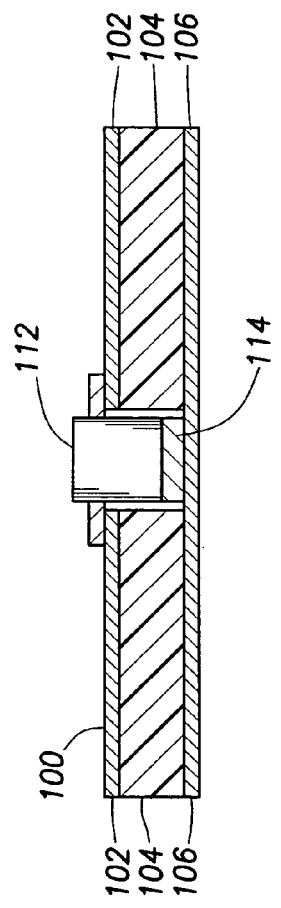
Figure 2D:
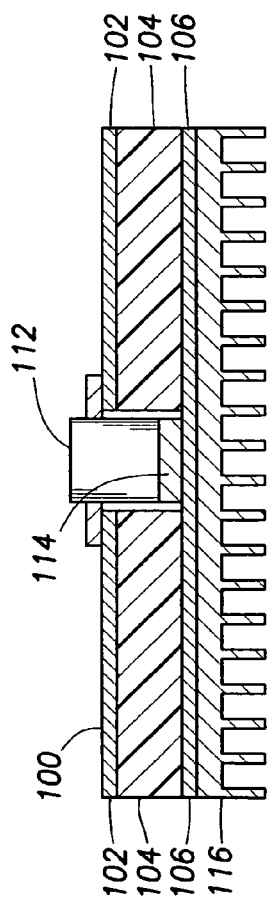

FIGS. 2a-2d illustrate an innovative system and method according to one embodiment of the present disclosure of mounting a high power transistor onto a printed circuit board using the bottom copper layer of the printed circuit board to solder mount the transistor flange. FIG. 2a illustrates PCB 100, which is a bare printed circuit board, having the dielectric layer 104 between the top copper layer 102 and the bottom copper layer 106. In FIG. 2b, transistor area 108 is formed by milling and etching an area out of PCB 100 that extends only through top copper layer 102 and dielectric layer 104, and stops at bottom copper layer 106. In FIG. 2c, bottom copper layer 106 is used to solder mount high power transistor 112 having flange 114. FIG. 2d illustrates that after transistor 112 is soldered to bottom copper layer 106 during infrared reflow, heatsink 116 can be attached directly to bottom copper layer 106 to provide thermal communication with heatsink 116. Consequently, not only has the use of carrier plate 110, as shown in FIGS. 1d and 1e, for mounting transistor 112 onto PCB 100 been eliminated, but also enhanced thermal contact and conductivity has been achieved because heatsink 116 is now in direct thermal communication with bottom copper layer 106.

The older methods of forming transistor areas used mechanical milling methods. The presently disclosed innovative method and system does not use mechanical drilling, but instead takes advantage of recent advances in laser technology that allow for greater vertical accuracy in milling-out the transistor area. These recent advances, for example, allow vertical milling accuracy on the order of ±0.0015 mils (0.039 mm). This accuracy allows the milling to stop at the bottom copper layer without disturbing the bottom copper layer which is typically only 1.4 mils thick (for 1 oz. copper weight) or 2.8 mils thick (for 2 oz. copper weight). This was not possible with the older mechanical milling methods normally used in such applications. Therefore, high power transistors can now be mounted to the bottom copper layer of printed circuit boards, and the need for a carrier plate has been eliminated. Accordingly, the associated costs of the materials and manufacturing processes required to mount high power devices to carrier plates have also been eliminated.

Figure 3A:
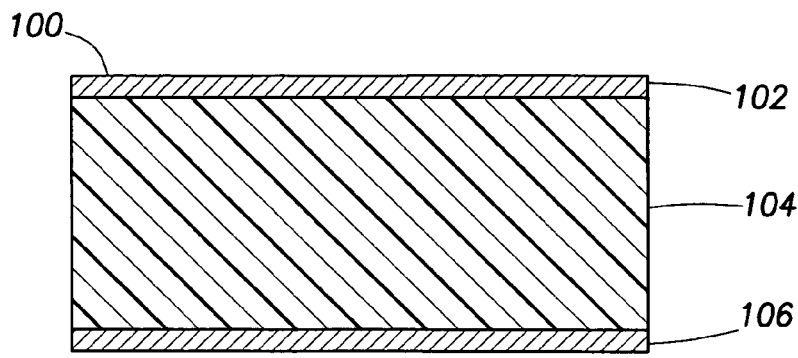
FIGS. 3a-3d illustrate a prior art method of mounting a surface mount transistor onto a printed circuit board and heat sink.
Figure 3B:
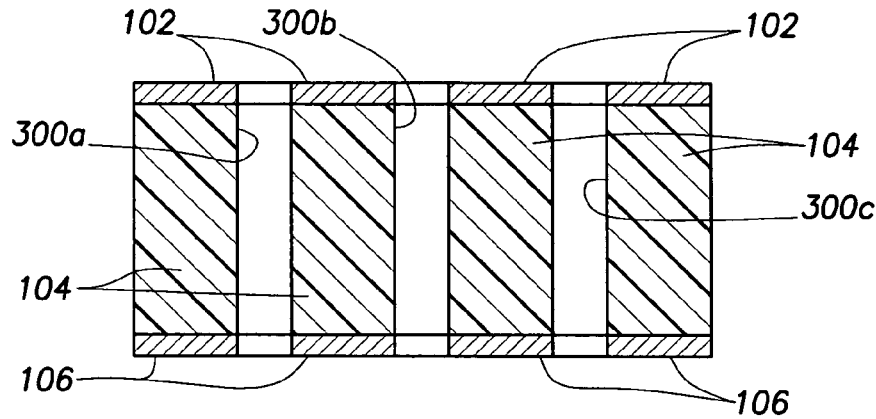
Figure 3C:
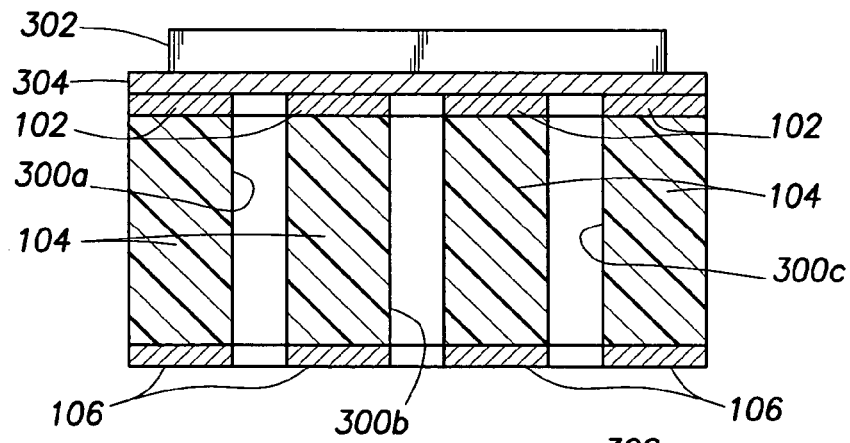
Figure 3D:
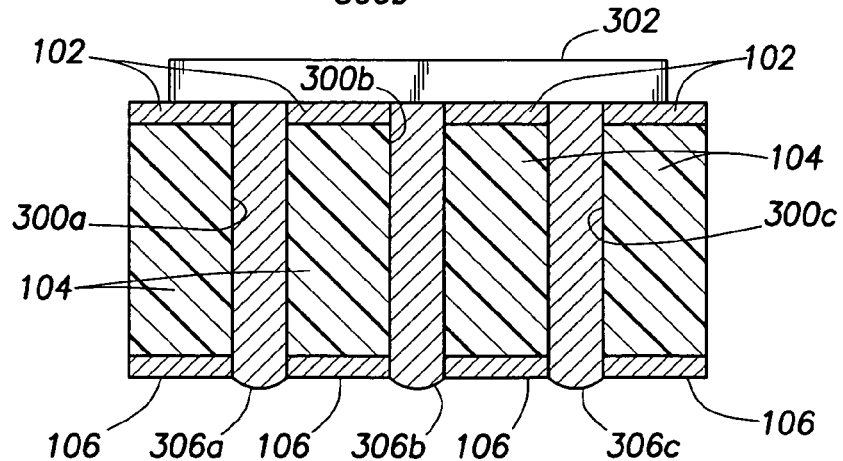

FIGS. 3a-3d illustrate a prior art method of mounting a surface mount transistor onto a printed circuit board and heat sink. FIG. 3a illustrates PCB 100, which is a bare printed circuit board, having the dielectric layer 104 between the top copper layer 102 and the bottom copper layer 106. FIG. 3b illustrates vias 300a, 300b, and 300c formed by plated drill holes of PCB 100 that extend through top copper layer 102, dielectric layer 104, and bottom copper layer 106. FIG. 3c illustrates a surface mount transistor 302 mounted onto the top side of PCB 100 using a solder layer 304. FIG. 3d illustrates bulges 306a, 306b, and 306c formed at the bottom of PCB 100. Theses bulges are formed as a result of gravity pulling solder layer 304 into and through vias 300a, 300b, and 300c during the IR reflow soldering process.

As illustrated in FIG. 3d, one problem is that the vias may never completely plug and always leak some amount of solder onto the bottom side of the printed circuit board. This results in the formation of bulges on the bottom side of the printed circuit board. The printed circuit board may be mounted onto a flat heatsink. However, the bulges prevent the bottom copper layer from making correct and intimate contact with the heatsink, which may cause poor thermal performance.

Solder leaks to the bottom side of the printed circuit board because the vias are formed by drilling through the entire printed circuit board. As a result, there is no backstop to prevent solder from leaking out. Therefore, bulges are formed as a result of prior art PCB fabrication methods, which did not allow any part of the printed circuit board to be used as a backstop to prevent solder from leaking to the bottom side.

One method of preventing bulges is to place a tape, such as polyimide film (Kapton) tape, over the bottom side of the printed circuit board prior to soldering. The tape acts as a backstop to prevent solder from leaking to the bottom side of the printed circuit board. However, this method involves placing tape on the bottom side of the printed circuit board prior to soldering and removing the tape after IR reflow. Accordingly, the use of tape results in additional material and process steps and, thus, added costs. However, methods, such as this, are necessary with the prior art if bulges are to be prevented to ensure correct and intimate contact with the heatsink.

Figure 4A:
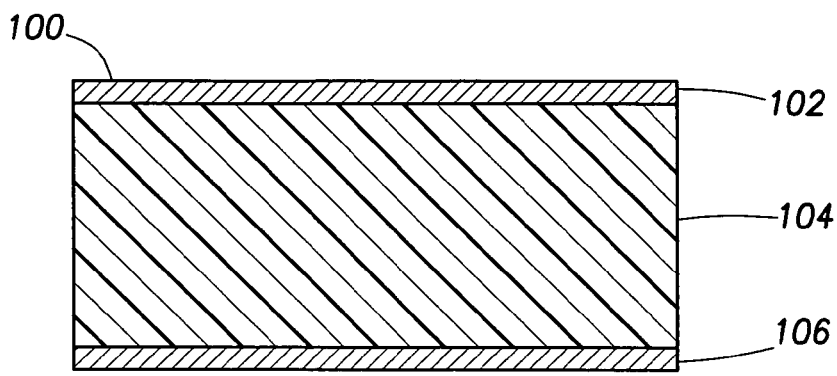
FIGS. 4a-4d illustrate an innovative system and method according to another embodiment of the present disclosure of mounting a surface mount transistor onto a printed circuit board and heat sink.
Figure 4B:
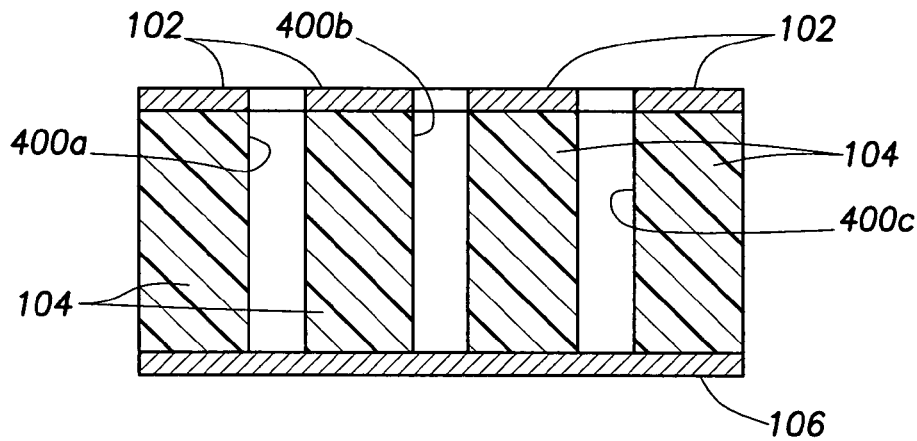
Figure 4C:
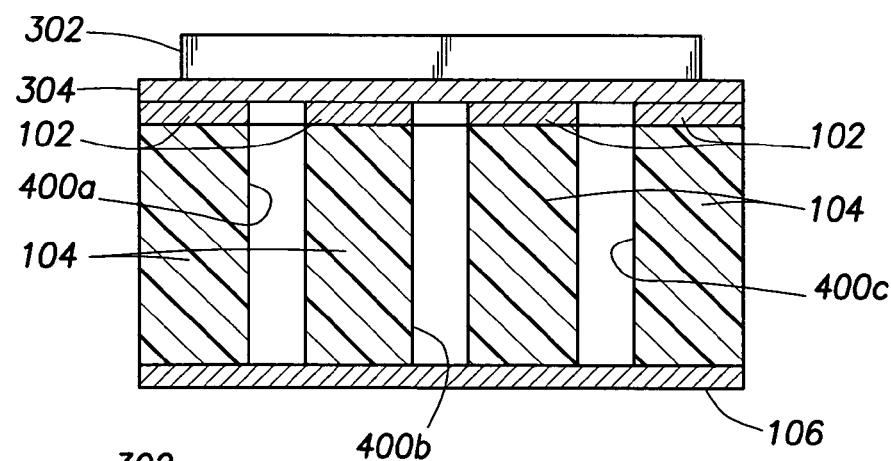
Figure 4D:
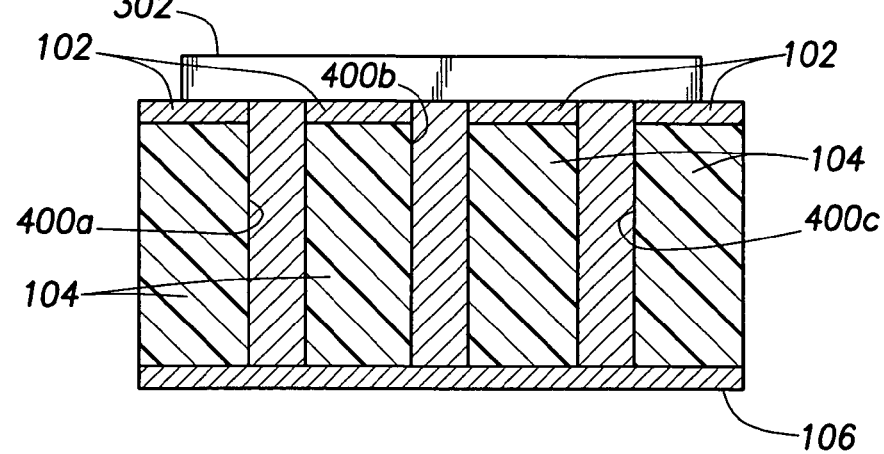

FIGS. 4a-4d illustrate an innovative system and method according to another embodiment of the present disclosure of mounting a surface mount transistor onto a printed circuit board and heat sink. FIG. 4a illustrates PCB 100, which is a bare printed circuit board having the dielectric layer 104 between the top copper layer 102 and the bottom copper layer 106. FIG. 4b illustrates vias 400a, 400b, and 400c formed by plated drill holes of PCB 100 that extend only through top copper layer 102 and dielectric layer 104, and stops at bottom copper layer 106 (in other embodiments, other numbers of vias could be present). FIG. 4c illustrates surface mount transistor 302 mounted onto the top side of PCB 100 using a solder layer 304. Although gravity pulls solder layer 304 into vias 400a, 400b, and 400c during the IR reflow soldering process, FIG. 4d illustrates how bottom metal layer 106 serves as a backstop to prevent solder layer 304 from leaking out of the vias during IR reflow. Accordingly, correct and intimate contact between bottom copper layer 106 of PCB 100 and a heatsink is now possible without the need for an additional step or steps to prevent the formation of bulges.

As with the previously disclosed innovative embodiment, this method and system also takes advantage of recent advances in laser technology that allow for greater vertical accuracy in drilling the vias. Using this vertical accuracy, the present disclosure stops the drilling at the bottom copper layer, which was not possible with previous mechanical drilling methods. Therefore, the bottom copper layer can now act as a backstop to prevent solder from leaking to the bottom side of the printed circuit board. Accordingly, the associated costs of the materials and manufacturing processes required to prevent solder leakage and the resulting bulges have been eliminated.

Figure 5:
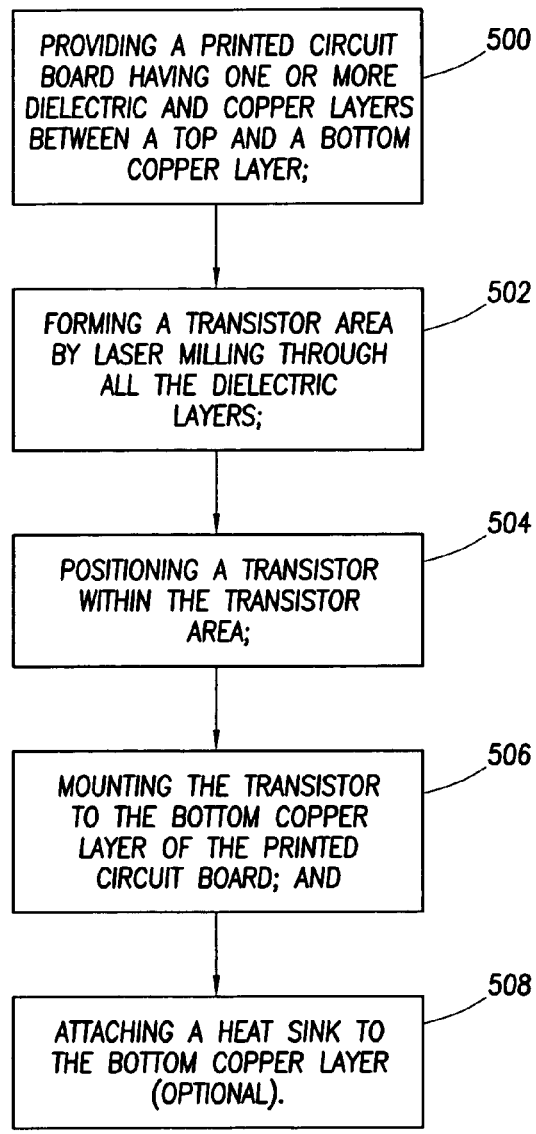
FIG. 5 is a flowchart according to an embodiment of the present disclosure.

FIG. 5 is a flowchart according to an embodiment of the present disclosure. At block 500, the method includes providing a printed circuit board having one or more dielectric and copper layers between a top and a bottom copper layer. The PCB in block 500 assumes that the copper layers have already been etched and all layers have been pressed and bonded together and that the PCB is milled, drilled, and plated by conventional methods. The final PCB fabrication step (block 502) is used to finish the PCB fabrication process. At block 502, the method also includes forming a transistor area by laser milling through all dielectric layers. At block 504, the method further includes positioning a transistor within the transistor area. At block 506, the method includes mounting the transistor to the bottom copper layer of the printed circuit board. At block 508, the method includes attaching a heat sink to the bottom copper layer (optional).

The flowchart in FIG. 5 can be simplified, at the option of the PCB fabricator, to combine blocks 500 and 502 into one block. This assumes that the PCB is fabricated in a traditional manner except that all drilling and milling is done using a laser. This option is for PCB fabricators who are more technically advanced than other fabricators and use laser drilling and milling as a primary method of fabrication as opposed to mechanical drilling and milling.

Figure 6:
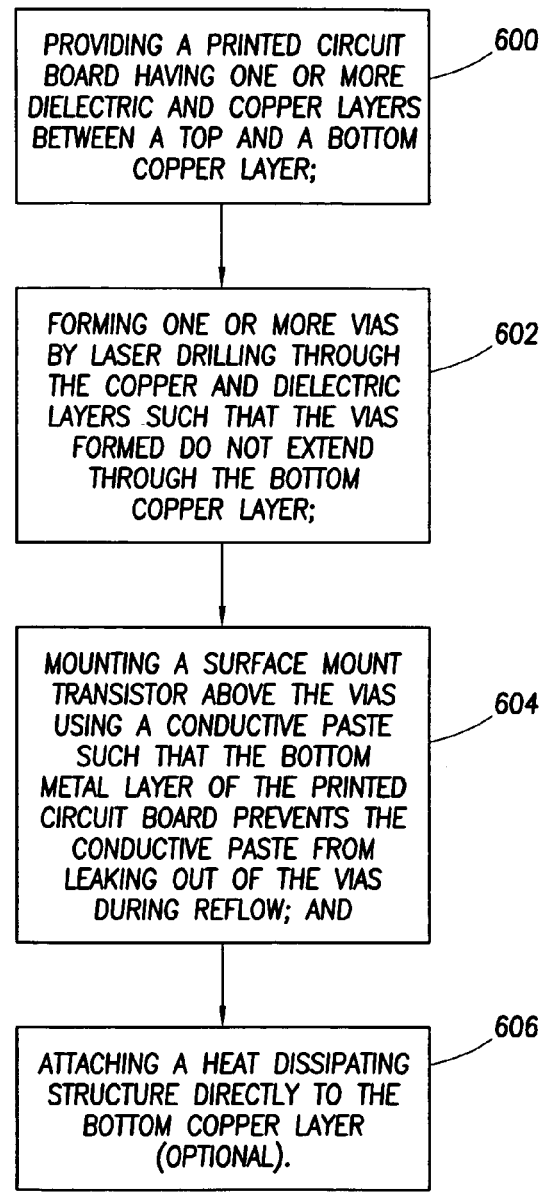
FIG. 6 is a flowchart according to another embodiment of the present disclosure.

FIG. 6 is a flowchart according to another embodiment of the present disclosure. At block 600, the method includes providing a printed circuit board having one or more dielectric and copper layers between a top and a bottom copper layer. The PCB in block 600 assumes that the copper layers have already been etched and all layers have been pressed and bonded together and that the PCB is milled, but vias are not yet drilled and plated. The final PCB fabrication step (block 602) is used to finish the PCB fabrication process. At block 602, the method also includes forming one or more vias in the transistor area by laser drilling through all dielectric and copper layers such that the vias formed in the transistor area do not extend through the bottom copper layer. This laser drilling is performed within the transistor area. In all other areas of the PCB, conventional vias are made by drilling through all dielectric and copper layers as well as the bottom copper layer. At block 604, the method further includes mounting a surface mount transistor above the vias using a conductive paste (e.g. solder) such that the bottom copper layer of the printed circuit board prevents the conductive paste from leaking out of the vias during IR reflow. At block 606, the method includes attaching a heat dissipating structure directly to the bottom copper layer (optional).

Although the above innovative embodiments are described in terms of solder mounting, other types of conductive paste, of course, may also be used. Also, the above innovative embodiments are described using a heatsink. Other types of heat dissipating devices, of course, may also be used.

Also, the above innovative embodiments are described using a surface mount transistor. Other types of surface mount devices having bottom side copper pads, such as voltage regulators, analog-to-digital converters, and monolithic microwave integrated circuits, may also be used.

Also, the above innovative embodiments are described using a high power transistor. Other types of semiconductor devices, such as diodes, thyristors, and sensors, may also be used.

Additionally, the PCBs used for illustrative purposes in this document will in practice be multi-layer PCBs, composed of multiple copper and dielectric layers pressed together.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

What is claimed is:

1. A power device comprising:
a printed circuit board comprising at least one dielectric layer between and in contact with a top metal layer and a bottom metal layer;
an area extending through the at least one dielectric layer of the printed circuit board, the area extending through the top metal layer but not through the bottom metal layer; and
a semiconductor device positioned within the area and mounted to the bottom metal layer of the printed circuit board,
wherein vias are not present beneath the area.

2. The power device of claim 1, wherein the semiconductor device is mounted to the bottom metal layer of the printed circuit board without the use of a carrier plate.

3. The power device of claim 1, wherein the top and bottom metal layers are further defined as a top and bottom copper layers.

4. The power device of claim 1, wherein a heat dissipating structure is attached directly to the bottom metal layer without the use of a carrier plate.

5. The power device of claim 4, wherein the heat dissipating structure is further defined as a heat sink.

6. The power device of claim 1, wherein the semiconductor device is selected from the group consisting of transistors, diodes, thyristors, and sensors.

7. The power device of claim 1, wherein the semiconductor device is further defined as a high power transistor having a power dissipation greater than 1 watt.

8. A printed circuit board comprising:
at least one dielectric layer between and in contact with a top metal layer and a bottom metal layer;
an area extending through the at least one dielectric layer of the printed circuit board, the area extending through the top metal layer but not through the bottom metal layer; and
a semiconductor device positioned within the area and mounted to the bottom metal layer of the printed circuit board,
wherein vias are not present beneath the area.

9. The printed circuit board of claim 8, wherein the semiconductor device is mounted to the bottom metal layer of the printed circuit board without the use of a carrier plate.

10. The printed circuit board of claim 8, wherein the top and bottom metal layers are further defined as a top and bottom copper layers.

11. The printed circuit board of claim 8, wherein a heat dissipating structure is attached directly to the bottom metal layer without the use of a carrier plate.

12. The printed circuit board of claim 11, wherein the heat dissipating structure is further defined as a heat sink.

13. The printed circuit board of claim 8, wherein the semiconductor device is selected from the group consisting of transistors, diodes, thyristors, and sensors.

14. The printed circuit board of claim 8, wherein the semiconductor device is further defined as a high power transistor having a power dissipation greater than 1 watt.

* * * * *